(12) United States Patent
Nakagawa

(10) Patent No.: US 6,326,264 B1
(45) Date of Patent: Dec. 4, 2001

(54) SEMICONDUCTOR DEVICE AND METHOD FOR MANUFACTURING SAME

(75) Inventor: Kenichiro Nakagawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/656,134

(22) Filed: Sep. 6, 2000

Related U.S. Application Data

(62) Division of application No. 09/350,137, filed on Jul. 9, 1999.

(30) Foreign Application Priority Data

Jul. 10, 1998 (JP) .................................................. 10-195236

(51) Int. Cl.$^7$ ........................ H01L 21/336; H01L 21/788
(52) U.S. Cl. ........................ 438/257; 438/258; 438/259; 438/261; 438/262; 438/266; 257/316
(58) Field of Search ..................................... 438/257, 258, 438/259, 261, 262, 263, 264, 266, 267; 257/316

(56) References Cited

U.S. PATENT DOCUMENTS

| | | | | |
|---|---|---|---|---|
| 5,559,048 | * | 9/1996 | Inoue ..................................... | 438/257 |
| 5,801,423 | | 9/1998 | Manning . | |
| 5,859,459 | | 1/1999 | Ikeda . | |
| 6,103,573 | * | 8/2000 | Harari et al. ......................... | 438/257 |
| 6,103,574 | * | 8/2000 | Iwasaki ................................. | 438/257 |
| 6,153,467 | * | 11/2000 | Wu ........................................ | 438/257 |
| 6,201,277 | * | 3/2001 | Esquivel ................................ | 257/316 |
| 6,228,713 | * | 5/2001 | Pradeep et al. ....................... | 438/257 |
| 6,251,729 | * | 6/2001 | Montree et al. ...................... | 438/257 |

FOREIGN PATENT DOCUMENTS

| | | |
|---|---|---|
| 5-183168 | 7/1993 | (JP) . |
| 6-283721 | 10/1994 | (JP) . |
| 7-142618 | 6/1995 | (JP) . |
| 7-14916 | 1/1996 | (JP) . |
| 9-246500 | 9/1997 | (JP) . |
| 10-12750 | 1/1998 | (JP) . |

* cited by examiner

Primary Examiner—Charles Bowers
Assistant Examiner—Brook Kebede
(74) Attorney, Agent, or Firm—Sughrue, Mion, Zinn, Macpeak & Seas, PLLC

(57) ABSTRACT

In a semiconductor device, a plurality of transistor elements, each of which is formed by a channel region, a source region, and a drain region, are provided on a substrate, this semiconductor device further having a first element separation region that is made of insulating material and formed by a foot that protrudes form the substrate surface between the transistor elements of a pair of neighboring transistors (6) and (6') or (6') and (6") toward the inside of the substrate and a wing that is connected to the foot (7), and that extends so as to cover the top of either the drain region or the source regions of each of the neighboring transistor elements (6) and (6').

3 Claims, 5 Drawing Sheets

SEMICONDUCTOR DEVICE AND METHOD FOR MANUFACTURING SAME

This is a divisional of application Ser. No. 09/350,137 filed Jul. 9, 1999, the disclosure of which is incorporated herein by reference.

BACKGROUND OF THE INVENTION

1. Field of the Invention

The present invention relates to a semiconductor device and a method for manufacturing a semiconductor device, and more specifically it relates to a semiconductor device in which a diffusion layer and an element separation insulation film are formed in a self-aligning manner, and to a method for manufacturing such as semiconductor device.

2. Description of the Related Art

In the past, with respect to a method for manufacturing a non-volatile semiconductor memory device such as a flash memory, there have been many disclosures of known technologies.

For example, one example of a method for manufacturing a flash memory in the past was disclosed in the Japanese Unexamined Patent Publication (KOKAI)No. 6-283721, the technological purport of which will be described with reference to FIG. 12 (A) through FIG. 12(G).

Specifically, in this method of the past, as shown in FIG. 12(A), a known lithographic method is first used to form the element separations 201 and 202, after which, as shown in FIG. 12(B), a silicon oxide film 203, which will serve as a tunnel film, is formed.

Next, as shown in FIG. 12(C), polysilicon 204, which will serve as a floating gate, and an ONO film 205, which will serve as a capacitive film between the control gate and floating gate are formed, after which, as shown in FIG. 12(D), lithography is used to pattern the ONO film 205 and the polysilicon 204, and ion implantation is used to form the source and drain 213 and 214.

Additionally, as shown in FIG. 12(E), the drain side only is covered by a mash, and the source is subjected to ion implantation, so as to impart to the source a structure with a high withstand voltage.

Finally, as shown in FIG. 12(E), resist is removed and, after oxidizing the diffusion layer and the side surface of the floating gate 204, as shown in FIG. 12(G) polysilicon 219, which will serve as the control gate, is formed, patterning being done of the control gate 219, the ONO film 205, and the floating gate 204, in this sequence, so as to form the memory cell.

In the method for manufacturing a non-volatile semiconductor memory device of the past, however, because the channel region and the element separation region are formed by separate lithography process steps, skew of position in the lithography process can cause a change in width of the channel region and element separation region, the result being non-uniformity in the characteristics of the memory cells.

For this reason, it is necessary to provide a sufficient diffusion layer width with respect to this variation, the result being the problem that the size of the memory cell increases.

In the Japanese Unexamined Patent Publication (KOKAI) No. 7-142618, there is disclosure of a method of forming a source region, and drain region, and an element separation region that are each self-aligning.

However, this method involves complex film growing processes, the number of process steps being large, and the cost being high, in addition to the problem that it is difficult to make the size of each individual transistor small.

Accordingly, it is an object of the present invention to improve on the above-noted drawbacks of the prior, by providing a semiconductor device in which the channel region, diffusion layer region, and element separation region of a transistor element are all established by one lithography step, the widths of each of these regions being thereby uniquely established, thereby enabling the suppression of non-uniformity in the characteristics of the memory cells and enabling the size of the transistor elements to be made small.

A further object of the present invention is to provide a method for manufacturing the above-noted semiconductor device.

SUMMARY OF THE INVENTION

In order to achieve the above-noted objects, the present invention adopts the following basic technical constitution.

Specifically, the first aspect of the present invention is a semiconductor device in which there is a plurality of transistor elements disposed on a substrate, these transistor elements being formed by a channel region, a source region, and a drain region, this semiconductor device being minimally provided with a first element separation region that is made of an insulating material and formed by a foot that protrudes from the substrate surface between the transistor elements of a pair of neighboring transistors toward the inside of the substrate and a wing that is connected to the above-noted foot, and that extends so as to cover the top of either the drain region or the source region of each of the neighboring transistor elements.

The second aspect of the present invention is a method for manufacturing a semiconductor device, this method having a first step of obtaining a multilayer film structure which is formed by the sequential forming, on a semiconductor substrate, of a silicon oxide film layer, a polysilicon film layer, a silicon oxide film layer, and a silicon nitride film layer, in that sequence, a second step of applying a resist mask to the above-noted silicon nitride film layer, and then using this resist mask to perform etching processing, thereby performing patterning of at least the silicon nitride film layer, the silicon oxide film layer, and the polysilicon film layer of the above-noted multilayer film structure, so that the multilayer film structure is minimally left in a region that is to be used for the formation, on the substrate, of a channel region and an element separation region, the multilayer film structure being removed in other regions of the substrate, a third step of removing the above-noted resist and the silicon oxide film on the substrate, a fourth step of forming a silicon film layer on the substrate surface and the side surface of the polysilicon film layer, a fifth step of implanting an impurity into the substrate via the silicon oxide film that was formed in the fourth step, so as to form a source diffusion layer and a drain diffusion layer, a sixth step of using a silicon oxide film filling the space that is formed between the opposing source region and drain region, a seventh step of covering the above-noted silicon oxide film with a resist film, and then performing etching while patterning this resist, so as to remove the silicon oxide film that opposes the part of the multilayer film structure in which an element separation part will be formed, an eighth step of removing the above-noted resist, and then further etching the above-noted silicon oxide film to remove the silicon nitride film layer, the silicon oxide film, and the polysilicon film layer that makes up the multilayer film structure in part of the substrate in which the element separation part is to be formed, this further etching thereby forming a trench in the substrate part in which the element separation part is to be formed, a ninth step of filling the entire above-noted trench with a silicon oxide film, and then either polishing or etching this silicon oxide film so as to expose the silicon nitride film layer of the multilayer film structure in a region of the substrate surface in which the channel region is to be formed, a tenth step of etching the above-noted silicon oxide film and etching the silicon nitride film layer and the silicon oxide film in the region of the multilayer film structure in which the channel region is to be formed, so as to expose the polysilicon film layer, and eleventh step of forming a polysilicon film layer on the above-noted polysilicon film layer and silicon oxide film layer, and performing prescribed patterning thereof, so as to leave part of the polysilicon film layer on the surface of the silicon oxide film, a twelfth step of forming an ONO film (silicon oxide film silicon nitride silicon oxide film structure) on the polysilicon film layer, and a thirteenth step of forming a polysilicon film on the above-noted ONO film.

By adopting the above-described technical constitution, a method for manufacturing a semiconductor device according to the present invention enables the establishment of the channel region, the diffusion layer region, and the element separation region of a memory cell in a single lithography step, thereby uniquely establishing the width of each of these regions, and enabling the suppression of non-uniformity in the characteristics of the memory cells.

For this reason, it is not necessary to impart a margin to the width of the diffusion layer, and it is possible to make the width of the diffusion layer small, and to make the memory cell surface area small.

DESCRIPTION OF THE PREFERRED EMBODIMENTS

Embodiments of a semiconductor device and method for manufacturing a semiconductor device according to the present invention are described in detail below, with references being made to relevant accompanying drawings.

Figure 1:
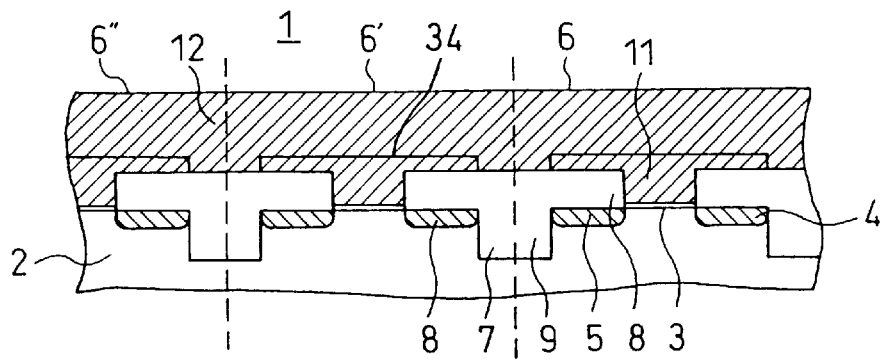
FIG. 1 is a cross-section view that shows the configuration of an embodiment of a semiconductor device according to the present invention.
Figure 2:
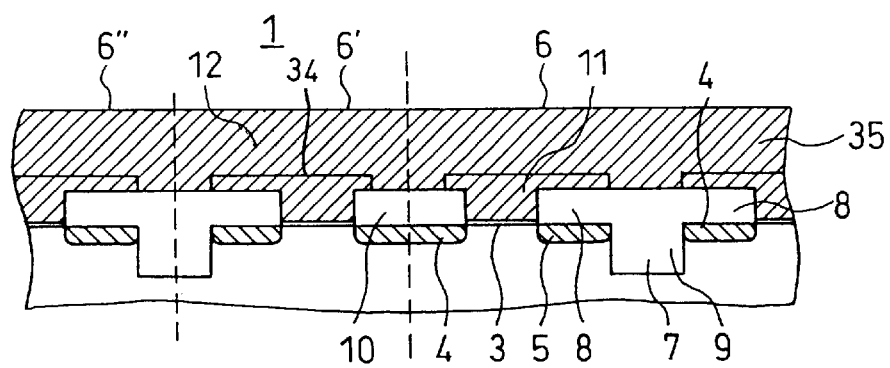
FIG. 2 is a cross-section view that shows the configuration of another embodiment of a semiconductor device according to the present invention.

Specifically, FIG. 1 and FIG. 2 are cross-section views which show embodiments of the configuration of an embodiment of a semiconductor device according to the present invention. FIG. 1 shows a semiconductor device 1, which has a plurality of transistor elements 6, each being formed by a channel region 3, a source region 4, and a drain region 5, which are formed on a substrate 2, this semiconductor device minimally having a first element separation region 9 that is made of an insulating material and formed by a foot 7 that protrudes from the substrate 2 surface between the transistor elements of a pair of neighboring transistors 6 and 6' or 6' and 6" toward the inside of the substrate 2 and a wing 8 that is connected to the above-noted foot 7, and that extends so as to cover the top of either the drain region 5 or the source region 4 of each of the neighboring transistor elements 6 and 6'.

In the same manner, FIG. 2 shows a semiconductor device 1, which has a plurality of transistor elements 6, each being formed by a channel region 3, a source region 4, and a drain region 5, which are formed on a substrate 2, this semiconductor device minimally having a first element separation region 9 that is made of an insulating material and formed by a foot 7 that protrudes from the substrate 2 surface between the transistor elements of a pair of neighboring transistors 6 and 6' or 6' and 6" toward the inside of the substrate 2 and a wing 8 that is connected to the above-noted foot 7, and that extends so as to cover the top of either the drain region 5 or the source region 4 of each of the neighboring transistor elements 6 and 6', and also a common source region 4 or a common drain region 5 that is common to transistor elements 6' and 6" and disposed between these transistor elements of another pair of neighboring transistor elements, and a second element separation region 10 that is formed so as to cover the upper surface part of the common source region 4 or the common drain region 5.

In the semiconductor device according to the present invention, it is desirable that the thickness of the wing 8 in the first element separation region 9 and the thickness of the second element separation region 10 be equivalent.

In the present invention, the transistor elements 6 form memory cells.

Additionally, the transistor elements 6 in the present invention can also form non-volatile memory cells.

In the present invention, if the transistor element 6 is a non-volatile memory cell, a floating gate 11 is provided above the channel region between the source region 4 and the drain region 5, and it is desirable that this floating gate 11 be extended over the upper surface of the wing 8 of the first element separation region 9.

It is additionally desirable in the present invention that the floating gate 11 be extended over the upper surface of the second element separation region 10.

In the present invention, a control gate is provided on the upper surface of the floating gate 11.

In the semiconductor device according to the present invention, between the above-noted floating gate 11 and control gate 12, it is also desirable that a NON (silicon oxide film silicon nitride film silicon oxide film structure), for example, be provided.

The method for manufacturing the semiconductor device that is shown in FIG. 2 is specifically described in detail below as an embodiment of the present invention, with references being made to FIG. 3 through FIG. 11.

Figure 3:
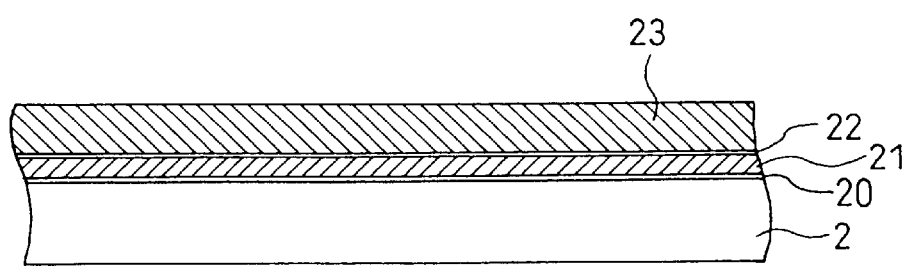
FIG. 3 is a cross-section view that illustrates the manufacturing process steps for an embodiment of a semiconductor device according to the present invention.

Specifically, referring to FIG. 3, a silicon oxide film layer 20 (having a film thickness of 80 to 120 Angstroms), a polysilicon film layer 21 (having a film thickness of 1000 to 1500 Angstroms), a silicon oxide film layer 22 (having a film thickness of 100 to 300 Angstroms), and a silicon nitride film layer 23 (having a film thickness of 1500 to 3000 Angstroms) are formed on a semiconductor substrate 2.

Figure 4:
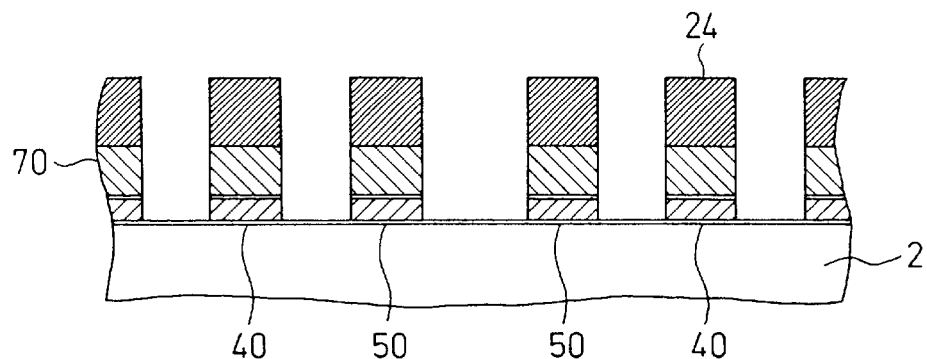
FIG. 4 is a cross-section view that illustrates the manufacturing process steps for an embodiment of a semiconductor device according to the present invention.

Next, as shown in FIG. 4, a resist mask 24 is used to pattern the silicon nitride film layer 23, the silicon oxide film layer 22, and the polysilicon film layer 21.

When the above is done, the region that is not etched and therefore remains, that is, the partial region of the multilayer film structure 70 of FIG. 4 that remains, is the region 40, in which will ultimately be formed the region 50 in which the memory cell channel 3 will be formed, and the first element separation region 9 will be formed.

Figure 5:
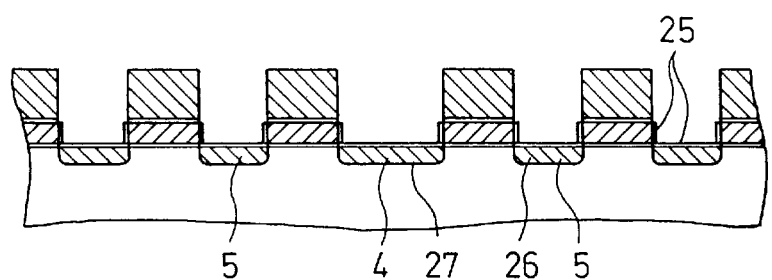
FIG. 5 is a cross-section view that illustrates the manufacturing process steps for an embodiment of a semiconductor device according to the present invention.

Next, referring to FIG. 5, after removing the resist 24 and the silicon oxide film 20 from the surface of the substrate 2, oxidation is done to form a silicon oxide film 25 onto the surface of the substrate 2 that is exposed at side surface of the polysilicon film layer 120, after Which ion implantation is done so as to form a source diffusion layer 27 and a drain diffusion layer 26.

When the above is done, it is possible to form a silicon oxide film side wall, achieving an LDD structure, or to offset the source side.

Figure 6:
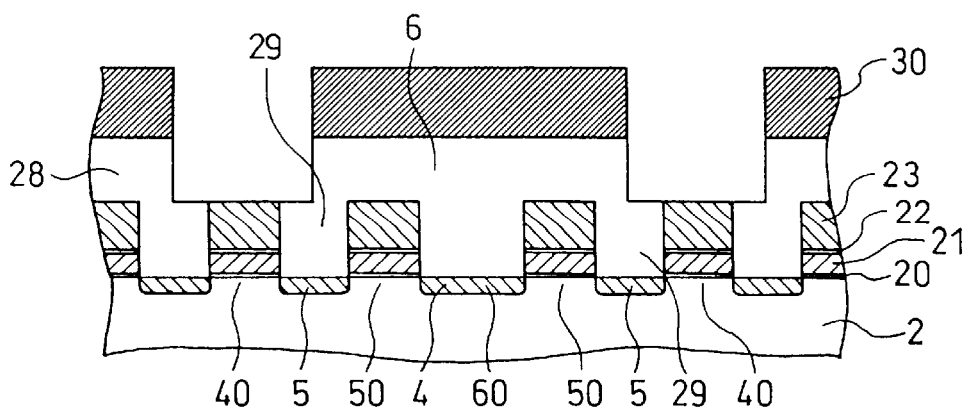
FIG. 6 is a cross-section views that illustrates the manufacturing process steps for an embodiment of a semiconductor device according to the present invention.

Next, as shown in FIG. 6, the space 28 formed between the mutually opposing source region 4 and drain region 5 is filled by a silicon oxide film layer 28 (film thickness of approximate 3000 to 6000 Angstroms), after which resist 30 is applied to this silicon oxide film layer 28, after which patterning is done thereof over the transistor element 6 to be formed as a memory cell, for example. Then etching is performed so as to expose the surface of the silicon nitride film 23 at the multilayer film structure 70 in the position that corresponds to the region 40 in which the first element separation region 9 is to be formed.

Figure 7:
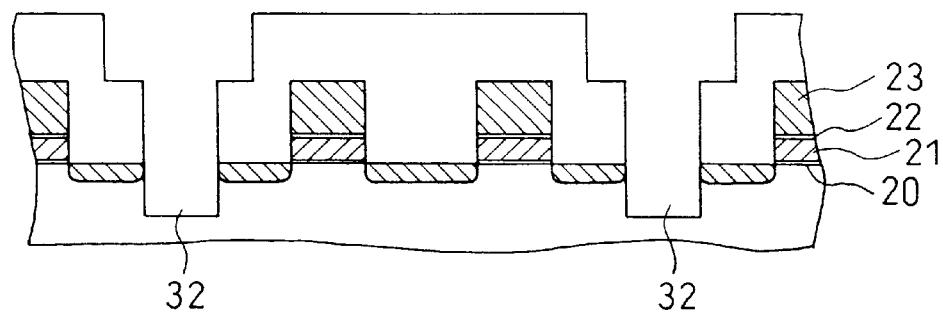
FIG. 7 is a cross-section view that illustrates the manufacturing process steps for an embodiment of a semiconductor device according to the present invention.

Next, as shown in FIG. 7, after removing the resist 30, etching is done to remove the silicon nitride film layer 23, the silicon oxide film layer 22, the polysilicon film layer 21, and the silicon oxide film layer 20 on the region 40 in which the first element separation region 9 is to be formed, and further etching is done to form a trench 32 in the semiconductor substrate 2.

Figure 8:
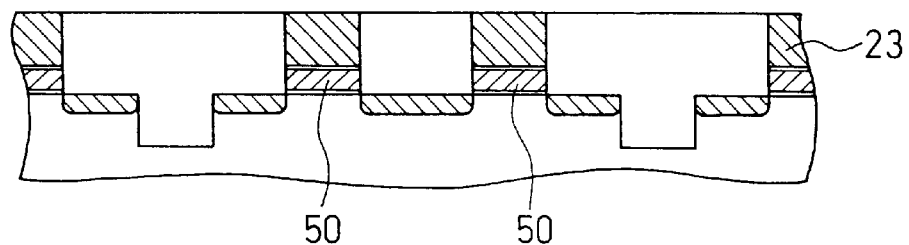
FIG. 8 is a cross-section view that illustrates the manufacturing process steps for an embodiment of a semiconductor device according to the present invention.

Next, as shown in FIG. 8, another silicon oxide film is used to fill the above-noted trench 32, and CMP or etching is performed so that the surface of the silicon nitride film layer 23 at the channel region 50 of the transistor element 6 that will form the memory cell is exposed.

Figure 9:
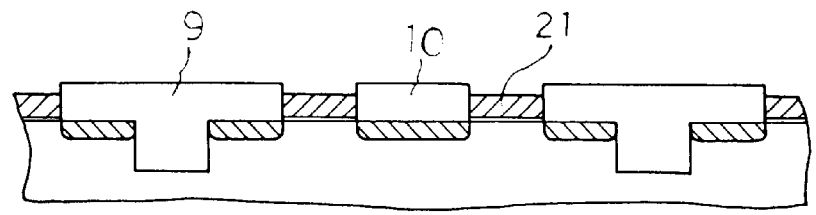
FIG. 9 is a cross-section view that illustrates the manufacturing process steps for an embodiment of a semiconductor device according to the present invention.

Next, as shown in FIG. 9, the silicon oxide film on the side surface of the silicon nitride 23 is etched to make its height small, the silicon nitride film layer 23 and the silicon oxide film layer 22 on the channel region 50 being removed in this sequence, so that the polysilicon film layer 21 appears at the surface.

When the above is done, it is desirable that the configuration be such that the above-noted polysilicon film layer 21 be lower than the surface of the silicon oxide film that forms the first or second element separation region 9 or 10, respectively.

Figure 10:
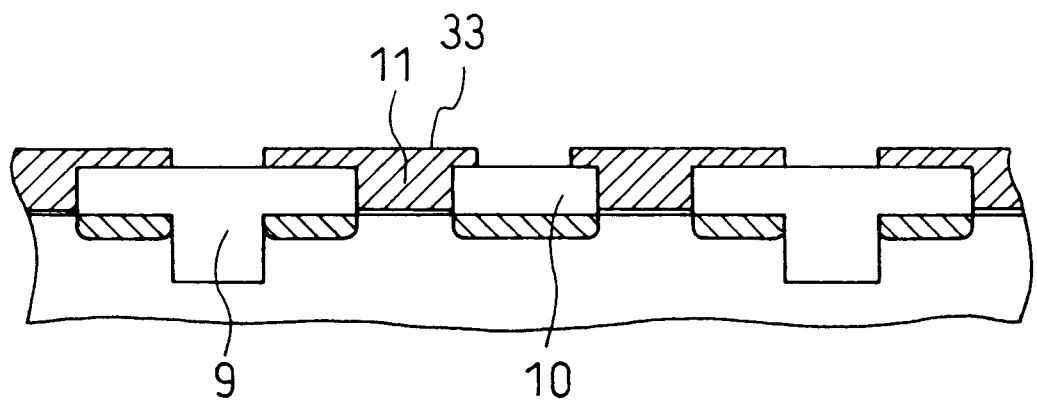
FIG. 10 is a cross-section view that illustrates the manufacturing process steps for an embodiment of a semiconductor device according to the present invention.

Next, referring to FIG. 10, a polysilicon film layer 33 is formed over the polysilicon film layer 21, and this is patterned.

This polysilicon film layer 33 and the polysilicon film layer 21 that was formed first form the floating gate 11.

Figure 11:
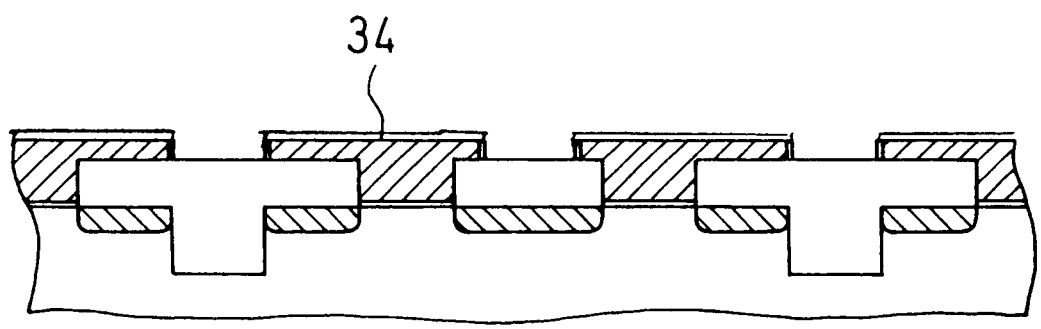
FIG. 11 is a cross-section view that illustrates the manufacturing process steps for an embodiment of a semiconductor device according to the present invention.
Figure 12:
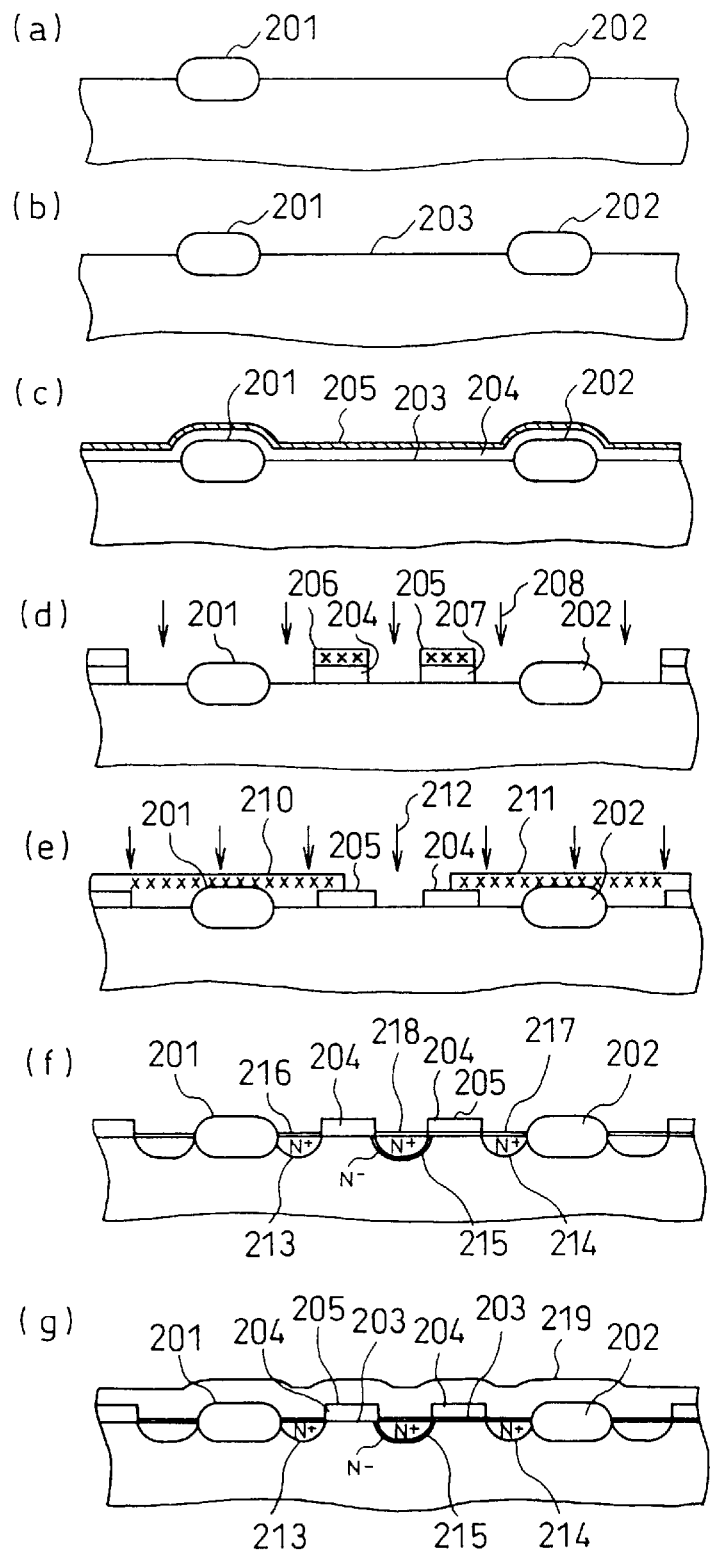
FIG. 12(A) through FIG. 12(G) are cross-section views that illustrate the manufacturing process steps for a semiconductor device according to the prior art.

Next, as shown in FIG. 11, an ONO film (silicon oxide film silicon nitride film silicon oxide film structure, with a film thickness of 100 to 200 Angstroms) is formed as an interlayer film between the control gate 12 and the floating gate 11.

Next, as shown in FIG. 2, a polysilicon film 35 that will serve as the control gate 12 is formed, and a resist mask is used to simultaneously pattern the control gate 12, the ONO film 34, and the floating gate 11.

When the above is done, in order to achieve a low resistance in the control gate 12, tungsten silicide or the like can be formed over the polysilicon film layer 35 that will serve as the control gate 12. Then, using a known method, interlayer films between interconnects, contact holes, and interconnects are formed, thereby completing the memory cell.

As explained above, since in accordance with the present invention, a size of the channel region, the diffusion layer region, and the element separation region of a memory cell can be established in a single lithography step, thereby uniquely establishing the thickness and the width of each of these regions and making them minimize, so as to minimize a total size of the memory cells.

Note that, in the present invention, it is possible to make the width of the diffusion region identical to the width of the element separation region or to make the width of the channel region identical to that of the element separation region in the memory cell, for example.

An example of the operation of the above-noted semiconductor device 1 is described below.

Specifically, in a non-volatile semiconductor device according to the present invention, by applying a negative voltage (for example, −9 V) to the control gate 12 and a positive voltage (for example, 4 V) to the drain 5, an FN channel current is caused to flow, so that the pulling of electrons from the floating gate 11 to the drain 5 is written.

By applying a positive voltage (for example, 12 V) to the control gate 12 and grounding the drain 5 and the well, FN tunnel current is caused to flow, so that the injection of electrons from the drain 5 to the floating gate 11 is erased.

With regard to this erasure method, it is also possible to inject electrons from the source 4 by grounding the source 4 and the well, and to inject from both sides by grounding the source 4, the drain 5, and the well.

In the present invention, although drain disturb and gate disturb occur when writing, with regard to gate disturb by writing into a plurality of memory cells simultaneously, time during which gate disturb occurs is shortened. This also improves the writing speed.

With regard to drain disturb, by forming a selection transistor for each of a plurality of memory cells, and making a division between main bit lines and sub-bit lines, so that sub-bit lines are simultaneously selected when writing, the amount of time drain disturb occurs can also be shortened.

When reading data in the present invention, discrimination of the 0 and 1 states is made by judging whether a channel current flows when a positive voltage (for example, 3 V) is applied to the control gate 12 and a positive voltage (for example, 1 V) is applied to the drain 5.

Another embodiment of a semiconductor device according to the present invention has the above-noted configuration described with reference to the semiconductor device shown in FIG. 1 and is manufactured by a method that is approximately the same as that described above.

Whereas, as can be seen from the cross-section view shown in FIG. 1, which is cut in a direction that is parallel to the memory cell word line, in the first embodiment the source 4 or drain 5 is shared by two transistor elements 6 and 6', in the second embodiment, each of the transistor elements 6, 6', and 6" has a source 4 and a drain 5.

As is clear from the foregoing description, an embodiment of a method for manufacturing a semiconductor device according to the present invention can be envisioned as having the following constitution.

Specifically, the above-noted method is a method for manufacturing a semiconductor device, this method having first step of obtaining a multilayer film structure which is formed by the sequential forming, on a semiconductor substrate, of a silicon oxide film layer, a polysilicon film layer, a silicon oxide film layer, and a silicon nitride film layer, in that sequence, a second stop of applying a resist mask to the above-noted silicon nitride film layer, and then using this resist mask to perform etching processing, thereby performing patterning of at least the silicon nitride film layer, the silicon oxide film layer, and the polysilicon film layer of the above-noted multilayer film structure, so that the multilayer film structure is minimally left in a region that is to he used for the formation, on the substrate, of a channel region and an element separation region, the multilayer film structure being removed in other regions of the substrate, a third step of removing the above-noted resist and the silicon oxide film on the substrate, a fourth step of forming a silicon film layer on the substrate surface and the side surface of the polysilicon film layer, a fifth step of implanting an impurity into the substrate via the silicon oxide film that was formed in the fourth step, so as to form a source diffusion layer and a drain diffusion layer, a sixth step of using a silicon oxide film filling the space that is formed between the opposing source region and drain region, a seventh step of covering the above-noted silicon oxide film with a resist film, and then performing etching while patterning this resist, so as to remove the silicon oxide film that opposes the part of the multilayer film structure in which an element separation part will be formed, an eighth step of removing the above-noted resist, and then further etching the above-noted silicon oxide film to remove the silicon nitride film layer, the silicon oxide film, and the polysilicon film layer that makes up the multilayer film structure in part of the substrate in which the element separation part is to be formed, this further etching thereby forming a trench in the substrate part in which the element separation part is to be formed, a ninth step of filling the entire above-noted trench with a silicon oxide film, and then either polishing or etching this silicon oxide film so as to expose the silicon nitride film layer of the multilayer film structure in a region of the substrate surface in which the channel region is to be formed, a tenth step of etching the above-noted silicon oxide film and etching the silicon nitride film layer and the silicon oxide film in the region of the multilayer film structure in which the channel region is to be formed, so as to expose the polysilicon film layer, and eleventh step of forming a polysilicon film layer on the above-noted polysilicon film layer and silicon oxide film layer, and performing prescribed patterning thereof, so as to leave part of the polysilicon film layer on the surface of the silicon oxide film, a twelfth step of forming an ONO film (silicon oxide film silicon nitride silicon oxide film structure) on the polysilicon film layer, and a thirteenth step of forming a polysilicon film on the above-noted ONO film.

In a method for manufacturing a semiconductor device according to the present invention, it is desirable that the polysilicon film layer that is formed in the above-noted eleventh step form a floating gate, and that the polysilicon film layer that is formed in the above-noted thirteenth step form a control gate.

According to the method for manufacturing a semiconductor device according to the prior art, because separate lithography steps were used to form the channel region and element separation region, skew of position in the lithography process caused a change in width of the channel region and element separation region, the result being non-uniformity in the characteristics of the memory cells. For this reason, it was necessary to provide a sufficient diffusion layer width with respect to this variation, the result being the problem that the size of the memory cell increases.

However, by virtue of adopting the above-described constitution, in a semiconductor device and a method for manufacturing same of the present invention, because in the case of a memory cell as represented for example by the transistor element 6 the channel region, the diffusion layer region, and the element separation region are established by a single lithography step, the widths thereof are uniquely established, making it possible to suppress non-uniformity in the characteristics of the memory cells. For this reason, using the present invention it is not necessary to impart a margin to the width of the diffusion layer, and it is possible to make the width of the diffusion layer small, and to make the memory cell surface area small.

In a non-volatile semiconductor memory device of the past having a 0.4 $\mu$m design rule, because the diffusion layer width was sufficiently large, the change in the diffusion layer width caused by skew in lithography was not that much of a problem.

However, accompanying the continuing shrinkage of the size of memory cells, there has been a continuing shrinking of the width of the diffusion layer, the result being that because the lithography position accuracy is not that good, there appears the problem of changes in the characteristics of the memory cells caused by position skew.

In particular in the case in which the design rule is 0.2 $\mu$m or smaller, there is a need to make the diffusion layer width be approximately 0.3 $\mu$m.

However, because the positioning skew accuracy is only approximately ±0.06 $\mu$m, the variation of as much as ±20% in the diffusion layer width is completely unacceptable.

Because in order to ensure normal operation, it is necessary to limit the variation in the memory cell characteristics to within ±10%, it is not possible to make the diffusion layer width smaller than 0.6 $\mu$m.

As a result, when manufacturing a non-volatile semiconductor memory device with a 0.2 $\mu$m design rule, the memory cell size is as follows, for the case in which the channel length is 0.2 μm, the element separation distance is 0.2 μm, the diffusion layer width is 0.6 μm, and the control gate L/S is 0.1/0. 2 μm.

In a memory cell with a common source line structure, because the element separation and source in common with other memory cells, the source diffusion layer width is 0.3 μm.

In a prior art memory cell, the size is $$(0.1+0.6+0.2+0.15)\times(0.2+0.2)=0.42\ \mu m^2.$$

In the present invention, however, the memory cell size is $$(0.1+0.3+0.2+0.15)\times(0.2+0.2)=0.30\ \mu m^2,$$

which is just 5/7 the size of the prior art memory cell.

In a memory cell with a separated source line structure, because only the element separation is in common with another cell, the size of a prior art memory cell is $$(0.1+0.6+0.2+0.6+0.1)\times(0.2+0.2)=0.64\ \mu m^2.$$

In contrast to this, the memory cell size in the case of the present invention is $$(0.1+0.3+0.2+0.3+0.1)\times(0.2+0.2)=0.40\ \mu m^2,$$

which is just 5/8 the size of the prior art memory cell.

What is claimed is:

1. A method for manufacturing a semiconductor device in which a silicon oxide layer, a polysilicon film layer, a silicon oxide film layer, and a silicon nitride film layer are formed in sequence onto a semiconductor substrate, said method comprising:

a first step of obtaining a multilayer film structure which is formed by the sequential forming, on a semiconductor substrate, of a first silicon oxide film layer, a first polysilicon film layer, a second silicon oxide film layer, and a silicon nitride film layer, in that sequence;

a second step of applying a first resist mask to said silicon nitride film layer, and then using said first resist mask to perform etching processing, thereby performing patterning of at least said silicon nitride film layer, said second silicon oxide film layer, and said first polysilicon film layer of said multilayer film structure, so that said multilayer film structure is minimally left in a region that is to be used for the formation, on said substrate, of a channel region and an element separation region, said multilayer film structure being removed in other regions of said substrate;

a third step of removing said first resist mask and said first silicon oxide film in said substrate;

a fourth step of forming a third silicon oxide film layer on said substrate surface and a side surface of said first polysilicon film layer;

a fifth step of implanting an impurity into said substrate via said third silicon oxide film layer that was formed in said fourth step, so as to form a source diffusion layer and a drain diffusion layer;

a sixth step of using a fourth silicon oxide film to fill a space that is formed between said opposing source region and drain region;

a seventh step of covering said fourth silicon oxide film with a resist film, and then performing etching while patterning said resist film, so as to remove said fourth silicon oxide film that opposes the part of said multilayer film structure in which an element separation part will be formed;

an eighth step of removing said resist film, and then further etching said fourth silicon oxide film to remove said silicon nitride film layer, said second silicon oxide film, and said first polysilicon film layer that make up said multilayer film structure existing in part of said substrate in which said element separation part is to be formed, this further etching thereby forming a trench in said substrate part in which said element separation part is to be formed;

a ninth step of filling the entire said trench with a fifth silicon oxide film, and then either polishing or etching said fifth silicon oxide film so as to expose said silicon nitride film layer of said multilayer film structure in a region of said substrate surface in which said channel region is to be formed;

a tenth step of etching said fifth silicon oxide film and etching said silicon nitride layer and said second silicon oxide film in a region of said multilayer film structure in which said channel region is to be formed, so as to expose said first polysilicon film layer, an eleventh step of forming a second polysilicon film layer on said first polysilicon film layer and said fifth silicon oxide film, and performing prescribed pattering thereof, so as to leave part of said second polysilicon film layer on the surface of said fifth silicon oxide film;

a twelfth step of forming an ONO film (silicon oxide film silicon nitride silicon oxide film structure) on said second polysilicon film layer; and a thirteenth step of forming a third polysilicon film layer on said above-noted ONO film.

2. A method for manufacturing a semiconductor device according to claim 1, wherein said second polysilicon film layer that is formed in said eleventh step forms a floating gate.

3. A method for manufacturing a semiconductor device according to claim 1, wherein said third polysilicon film layer that is formed in said thirteenth step forms a control gate.

* * * * *